United States Patent [19]

Yater

[11] 4,004,210
[45] Jan. 18, 1977

[54] REVERSIBLE THERMOELECTRIC CONVERTER WITH POWER CONVERSION OF ENERGY FLUCTUATIONS

[76] Inventor: Joseph C. Yater, Autumn Lane, Lincoln, Mass. 01773

[22] Filed: Sept. 15, 1975

[21] Appl. No.: 613,207

[52] U.S. Cl. .............................. 322/2 R; 136/200; 250/212; 310/4 R
[51] Int. Cl.² .................. H01L 37/00; H01L 35/00
[58] Field of Search ................. 321/1.5; 310/4 R; 322/2 R; 136/200; 250/212

[56] References Cited

UNITED STATES PATENTS 3,510,714   5/1970   Geer .................................. 310/4 X
3,760,257   9/1973   Fletcher et al. .................... 321/1.5

Primary Examiner—Robert J. Hickey
Attorney, Agent, or Firm—Nicholas Prasinos

[57] ABSTRACT

A thermal converter for transmitting electric energy fluctuations of small circuits at a higher temperature across a thermal barrier to small circuits at a lower temperature for high efficiency conversion of the electric energy fluctuations to electric power. Apparatus and circuits are disclosed which can transfer with a high coefficient of performance heat from the lower temperature circuits to the higher temperature circuits.

31 Claims, 10 Drawing Figures

REVERSIBLE THERMOELECTRIC CONVERTER WITH POWER CONVERSION OF ENERGY FLUCTUATIONS

BACKGROUND OF THE INVENTION

1. Field of the Invention

The invention relates generally to devices for directly converting thermal energy to useful electric energy, wherein the invention may also be utilized for directly pumping heat from a colder source to a higher temperature sink. More specifically, the invention relates to a device for utilizing with high efficiency the electric fluctuation energy of small circuits thermally insulated from other small circuits at a different temperature so as to produce useful electric energy. The same device also efficiently pumps heat from lower to higher temperature regions.

2. Description of the Prior Art

Devices for converting thermal energy directly into electric energy have been extensively investigated and the most commonly utilized devices have been the thermionic converters working from high temperature sources and silicon cells utilizing the input thermal energy of solar radiation. The present state-of-the-art has been limited to achieving efficiencies of 15% for thermionic converters and 16% for silicon solar cells. In addition to these limitations on efficiencies, the temperature range over which these devices can work efficiently has been limited to high temperatures in the range of 1400° to 2200° K for the emitter and 500° to 1200° K for the collector of the thermionic converters and to moderate operating temperatures in the range of less than 400° K for the temperature of the silicon solar cells.

The present invention removes these limitations along with providing other improvements in the performance of the direct conversion of thermal energy to electric energy. The thermal converter of this invention eliminates the electron cooling, radiation losses and lead losses of thermionic diode converters and operates reversibly as a heat pump over a wide temperature range. The efficiency for each working temperature range is determined by the physical dimensions of the circuits. The small circuits of this invention yield increased efficiency and power output or heat pump output. The efficiency of the small circuit devices of this invention also improves the efficiency when the input thermal energy is in the form of thermal radiation from a heated source such as solar radiation from the sun which is to be converted to useful power. The Carnot cycle efficiency obtainable from a heat source at solar temperature working with a heat sink at the ambient temperature on earth is over 90%. This invention achieves this efficiency as it is not limited by the heat losses resulting from the diffusion and thermal conduction processes of solar cells. The invention also improves on the efficiency obtainable from the small circuits of the prior art. A typical prior art device is disclosed in U.S. Pat. No. 3,760,257 issued Sept. 18, 1973, which discloses a device used with a directional wide band antenna system to convert radiation energy to useful output power. The improvement of the invention herein over the prior art results generally from minimizing or eliminating the losses resulting from eddy current losses on the receiving antenna surfaces. Also, the efficiency of converting the wide bandwidth radiation such as solar radiation is increased in the instant invention by minimizing or eliminating the losses that occur from impinging stray radiation from other directions and the losses resulting from incompletely utilized voltages from antenna element spacings approaching one wavelength, or from antenna element spacings less than one half wavelength.

OBJECTS OF THE INVENTION

A primary object of the instant invention is to provide an improved apparatus for directly converting thermal energy to electric energy.

Another object of the invention is to improve the efficiency of conversion of heat to electricity.

Still another object of the invention is to increase the power output from the thermal energy converter to a high power level.

It is a further object of the invention to increase the operating temperature range of the thermal energy converter so that efficient conversion over a wider range of temperatures is obtained.

It is a further object of the invention to provide an alternate mode of operating the device as a heat pump or a refrigerator with an improved coefficient of performance over a wide temperature range.

It is a yet further object of the invention to increase the types of heat sources with which the thermal converter operates to include solar, fossil, nuclear and geothermal heat sources.

It is still a further object of the invention to lower the temperature at which efficient operation is achieved so as to use the waste heat from other power plants as input heat sources for this thermal energy converter.

Yet another object of this invention is to decrease the weight and size of the thermal converter so as to increase the power output per unit volume and per unit weight of the thermal converter.

These and other objects and advantages of the invention will become apparent from the following description taken in accordance with the accompanying drawings which form a part of this application.

DETAILED DESCRIPTION OF THE PREFERRED EMBODIMENTS

In accordance with the invention, both the conversion of electric energy fluctuations to useful power output and the refrigeration cycle embodiments have increased efficiency over a wide range of working temperatures. The small microcircuits of the transducer modules convert electric energy fluctuations into a useful output with a high efficiency. This efficiency is over 90% for some applications. The lead conduction losses, electron cooling and radiation losses are minimized. This increase in efficiency is accomplished in part by using a vacuum or equivalent thermal barrier between the circuits at different temperatures and by providing an electrical path for the electric fluctuation energy. This is achieved by coupling the electric fluctuating energy using capacitors having a vacuum or equivalent thermal barrier between the capacitor plates and by separating the adjacent areas of the circuits of the modules 7 and 8 of FIGS. 1a, 1b and 2 by a vacuum or equivalent thermal barrier.

Figure 1A:
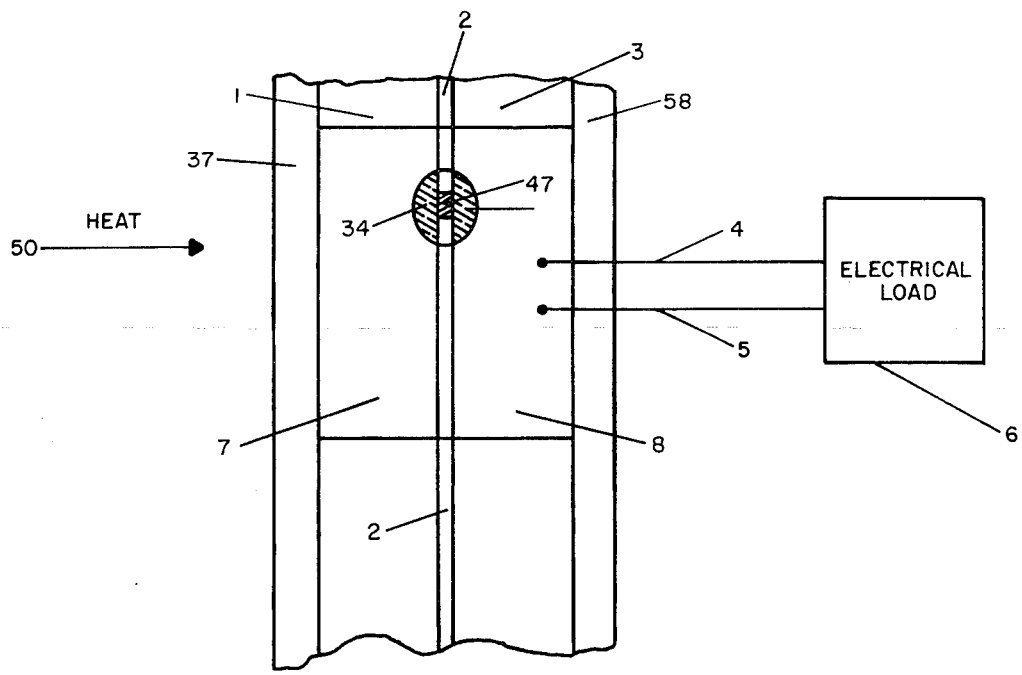
FIG. 1a is a sectional schematic view of one embodiment of the invention working in a power conversion mode.

Referring now to FIG. 1a of the drawings, incoming heat 50 from some heat source shown on the left side of the drawings is converted into electrical power for an electrical load 6 shown on the right side of the drawing. Thermal conduction layer 37 is the heated thermal conducting film which may typically be a metal or carbon film that is in thermal contact with layer 1 of the invention. This thermal conduction layer 37 is also thermally exposed by conduction, radiation or convection to the heat 50 from some heat source (not shown) and conducts this thermal energy to the layer 1 of the device. In this embodiment and for this application, the layer 1 is comprised of an assembly of modules 7 (to be more fully described infra) for transducing the incoming heat at the temperature of the source to electric energy fluctuations across potential barriers or electrical resistors. A low loss dielectric substrate 34 typically but not limited to sapphire supports the modules 7.

This fluctuating electrical energy is transmitted across a thermal barrier 2 from each module 7 of layer 1 to a corresponding conversion module 8 of layer 3. (The conversion module 8 will be more fully described infra). The thermal barrier 2 may be, but is not limited to, a vacuum thermal barrier in which the separation distance between layers 1 and 3 is maintained by spacing support 47. This separation distance is less than the dimensions of modules 7 and 8 in the plane of the layers 1 and 3. For the vacuum thermal barrier, the vacuum is maintained over a convenient area of the layers by making the spacing support 47 in the form of walls to enclose convenient areas between the layers 1 and 3. The separation walls 47 may typically be of a low thermal conductivity material such as glass but are not limited to this material. As will be described infra, the walls of the substrate 34 and 35 containing the vacuum may typically be plated with a metallic coating with a low net effective thermal emissivity such as gold. The layer 3 is maintained at a lower temperature by thermal contact with thermal conducting layer 58 which may typically be a metal or carbon film which is thermally exposed to the cooler reservoir sink at the lower temperature by conduction, convection or radiation. The modules 8 are supported on the low loss dielectric substrate 35 of layer 3 which may be of similar material to substrate 34. The conversion modules 8 of layer 3 for this power conversion mode rectify the fluctuating electrical energy to provide a direct current power output from each module 8.

The output power from all the modules 8 of layer 3 is combined in a series parallel network, to be described infra, to supply the total available output power of all the modules at the required voltage to the electrical load 6. The series-parallel circuit is connected to electrical leads 4 and 5 and the total available output power is conducted by leads 4 and 5 to the electrical load 6. Layers 1, 2, 3, 37 and 58 may be flexible and may extend in shape and area to conform to the application.

Figure 1B:
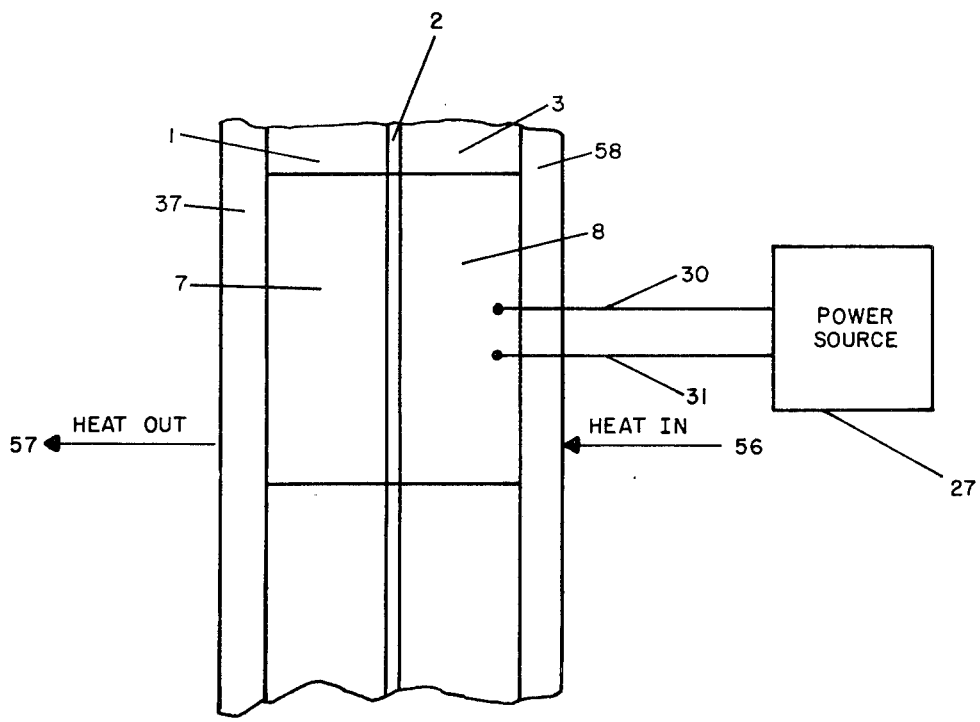
FIG. 1b is a sectional schematic view of another embodiment of the invention working in a heat pump mode.

An alternate embodiment of the invention is schematically shown on FIG. 1b. This embodiment utilizes the invention as a heat pump or refrigerator. Input power from a power source 27 is supplied to leads 30 and 31 to the series parallel network and to the modules 8. This reverses the direct current in each module 8 so that heat 56 is pumped across thermal conducting film 58 from the low temperature reservoir to the low temperature of the modules 8 and across the thermal barrier 2 to the higher temperature of the modules 7 of the layer 1 and to the thermal conducting film 37. From the thermal conducting film 37, the heat output 57 is transferred by conduction, convection or radiation to the higher temperature reservoir.

Figure 2:
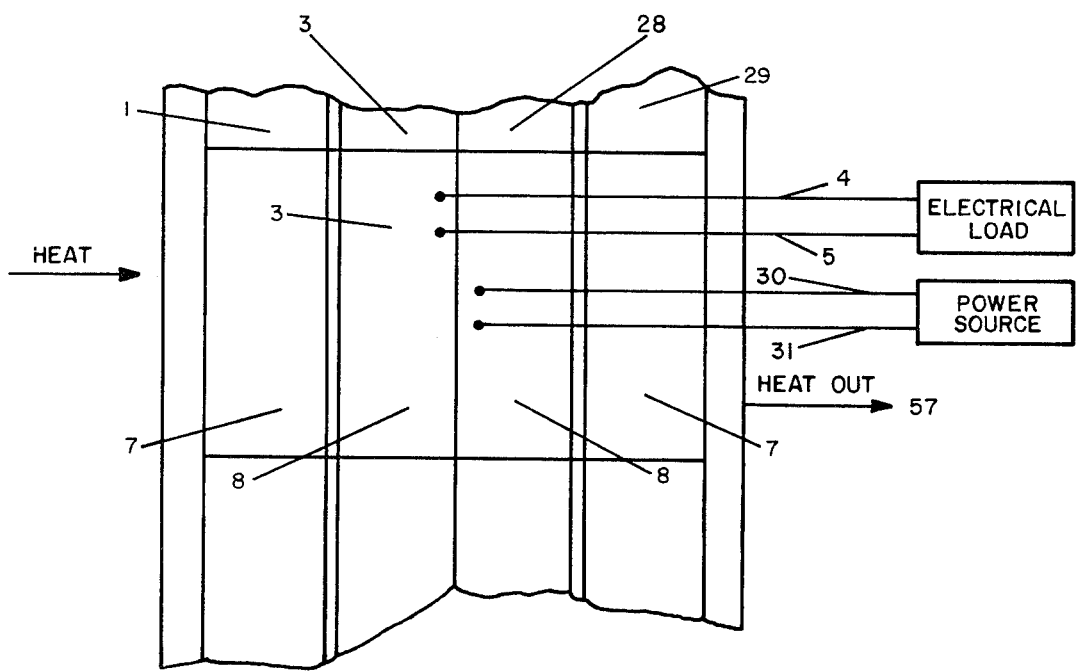
FIG. 2 is a sectional schematic view of still another embodiment of the invention in which two stages of thermal cycles enable higher efficiencies to be obtained.

FIG. 2 shows another embodiment of the invention wherein the embodiments of FIGS. 1a and 1b are combined so that modules 7 in layer 1 and modules 8 in layer 3 operate as in FIG. 1a to provide output power through leads 4 and 5, whereas modules 8 of layer 28 and modules 7 of layer 29 are to work in the heat pump or refrigeration mode as shown in FIG. 1b with the input power being transmitted by conductive leads 30 and 31. Layer 28 is in thermal contact with layer 3 and is thermally insulated from layer 29 by a thermal barrier layer 32 that may be similar to the thermal barrier 2 between layers 1 and 3. The addition of layers 28, 29 and 32 operating in the refrigeration mode to layers 1, 2, and 3 lowers the temperature of layer 3 so that for some components and designs of the rectifying modules 8, the overall efficiency of the power conversion of the two stages is improved.

Figure 3A:
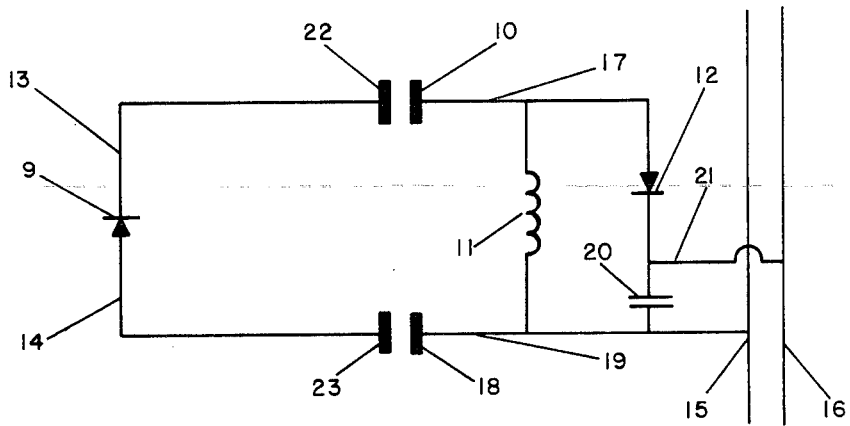
FIGS. 3a, 4, 5 and 6 are schematic views of the transducing modules that may be used in the invention for the conversion of the electric energy fluctuation to useful power output, or for refrigeration by pumping the electric energy fluctuations of a cold source to a hot sink.

FIG. 3a shows a schematic view of one embodiment of a circuit for the transducing module 7 and the conversion module 8. In this schematic view the circuit to the left of condenser plates 22 and 23 is the circuit of module 7 and, as stated supra, layer 1 of FIGS. 1a, 1b, and 2 is comprised of an assembly of modules 7. In this schematic view, condenser plates 22, 23, 10 and 18 are part of layer 2 of FIGS. 1a, 1b, and 2 as will be shown infra. Finally, in this schematic view the circuit to the right of condenser plates 10 and 18 is the circuit of module 8 and, as stated supra, layer 3 is comprised of an assembly of modules 8. In FIG. 3a the transducing modules 7 use a diode 9 as the source of the electric energy fluctuations which are transmitted by electrical leads 13 and 14 to the condenser plates 22 and 23. The other plates of the condensers 10 and 18 are on the other side of the vacuum or equivalent thermal barrier and are connected to the rectifying module 8. The condenser plate 10 is connected by lead 17 in module 8 to the high impedance inductance 11 and to the rectifying diode 12. The condenser plate 18 is connected by lead 19 to the other lead of the inductance 11, to the low impedance capacitor 20, and to the power output lead 15. The rectified output power from the diode 12 is conducted by connecting lead 21 to power output lead 16 and through the inductance 11 and lead 19 to power output lead 15. The power output to the leads 15 and 16 along with the power output from the other rectifying modules of the layer 3 are conducted to the electrical load using the leads 4 and 5 (see FIG. 1a).

Figure 3B:
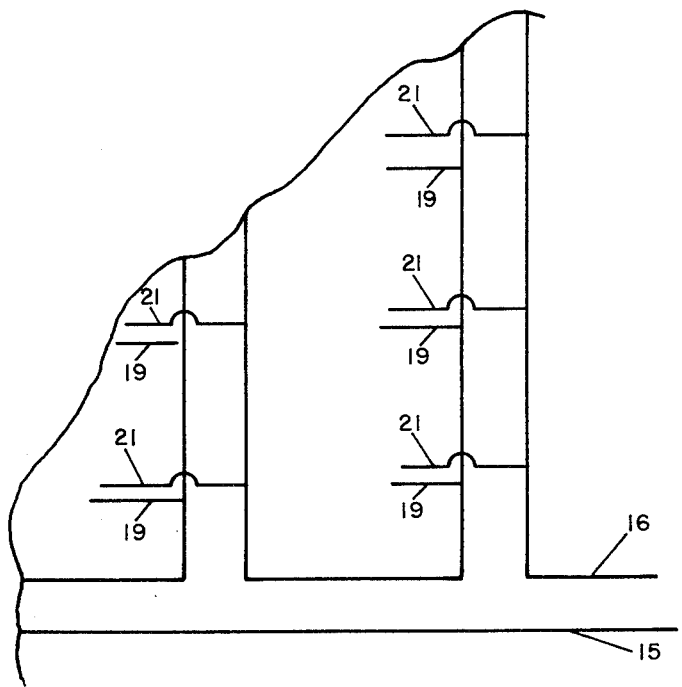
FIG. 3b is a schematic of the series-parallel circuit for combining the output power from all the transducing modules.

In FIG. 3b a schematic view is given to show one embodiment of a circuit to combine the output power from all the modules using a series-parallel circuit to produce a convenient final output voltage to leads 4 and 5. In this schematic, the module output powers of the rectifying modules 8 carried by the leads 19 and 21 in the vertical column are connected in parallel so that the total current of all modules in the vertical columns are added at a constant output voltage. Also, as shown in FIG. 3b the total output of each column is added in series so that the resultant output voltage to the load is the sum of the output voltages of each column.

Figure 3C:
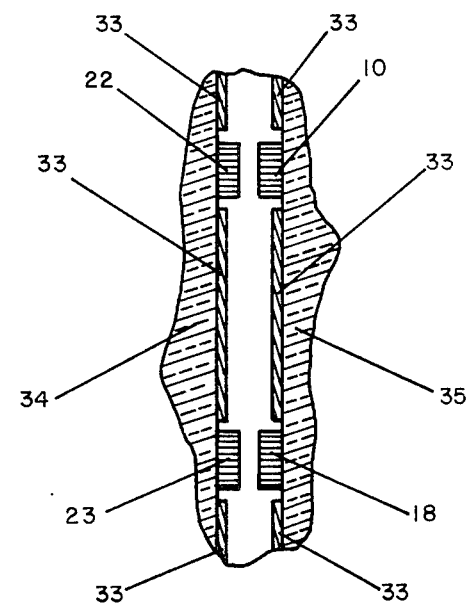
FIG. 3c is a sectional view of an embodiment for a component of the modules of FIGS. 3a, 4, 5 and 6.

In FIG. 3c the sectional view shows an embodiment of a construction of the vacuum thermal barrier and the condenser plates 22, 10, 23, and 18 by which the electric voltage fluctuations are transmitted from the higher temperature module 7 to the lower temperature module 8. The condenser plates 22, 10, 23, and 18 are constructed on the substrates 34 and 35 which form the opposite walls of the enclosed vacuum. These two adjacent walls of the substrates 34 and 35 are also plated as shown with a metallic coating 33 having a low net effective emissivity such as gold. The plated area of the walls covers all the area of both adjacent walls with the exception of the areas containing condenser plates 22, 23, 10 and 18 and a small separation area between the metallic coating 33 and the condenser plates. This separation area as shown in FIG. 3c electrically insulates the condenser plates 22, 23, 10 and 18 from the metallic coating 33 on the walls. This metallic coating enables the vacuum thermal barrier to minimize the amount of the heat loss by radiation across the walls of the vacuum. An embodiment of the thermal barrier shown as layer 2 in FIGS. 1a, 1b and 2 is comprised of an assembly of condenser plates 22, 23, 10 and 18 and the metallic coating layer 33 shown in FIG. 3c and the spacing support walls shown in FIG. 1a.

Figures 4, 5, 6:
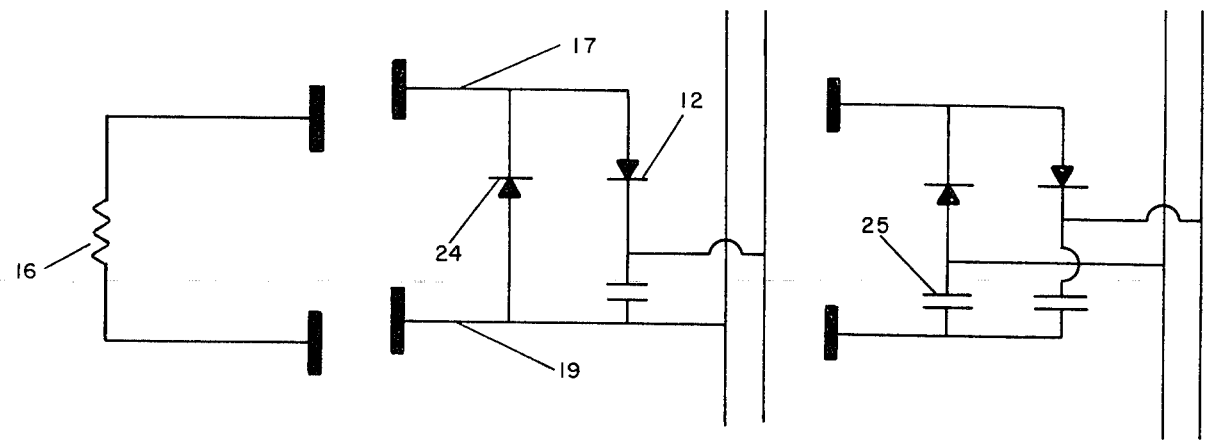

FIG. 4 is a schematic view of module 7 wherein a resistor or resistance film 26 is used as the source of the electric energy fluctuations.

FIG. 5 is a schematic view of the rectifying module 8 in which a diode 24 is connected to lead 17 with opposite polarity to that of diode 12. The other terminal of diode 24 is connected to lead 19 to provide a path for the rectified current in the module. FIG. 6 shows module 8 wherein the low impedance capacitor 25 is added to isolate the rectified output voltage from module 7.

Figure 7:
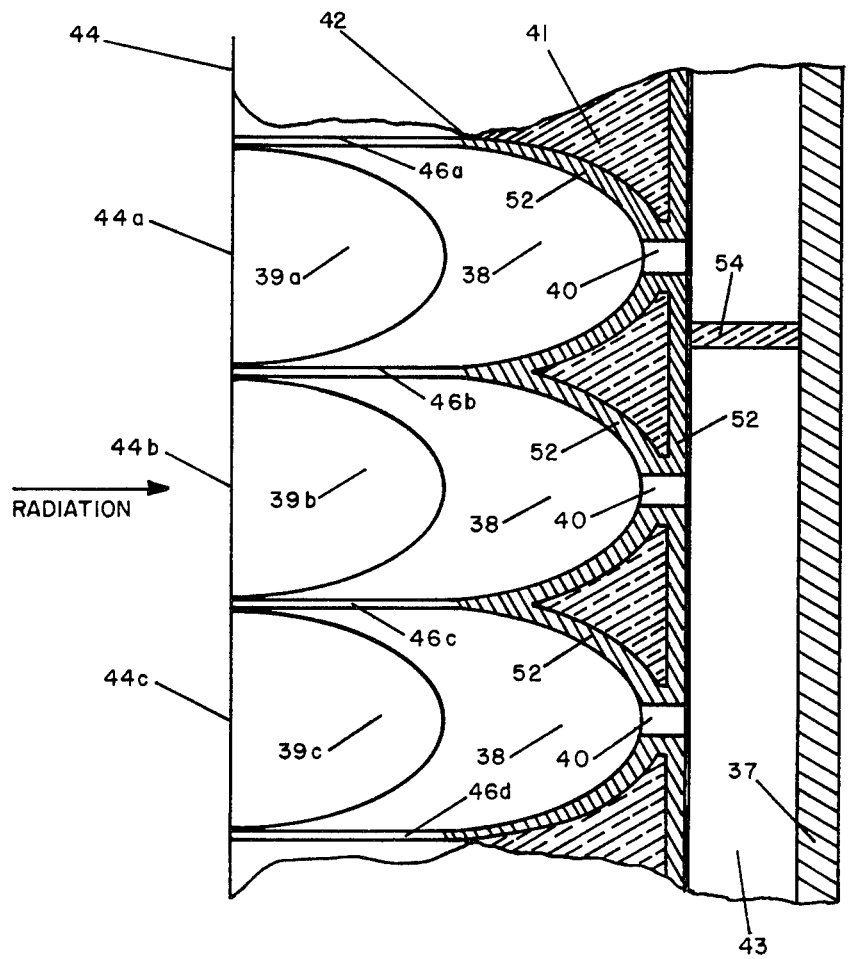
FIG. 7 is a sectional view of a layer for collecting radiation from the sun or other radiation sources for efficient conversion by the power conversion circuits of the invention.

Referring now to FIG. 7, there is shown a sectional view of layer 42 which is added adjacent to thermal conducting film 37 for the efficient conversion of radiation energy to thermal energy. This is another embodiment of the invention for converting solar radiation or other radiation to useful electric power. The incoming solar radiation is normally incident on plane 44 of layer 42. Plane 44 is divided into contiguous square cells 44a, 44b, 44c, etc., in both dimensions of plane 44 by walls 46a, 46b, 46c, 46d, etc., in horizontal planes normal to the plane of the drawing and by walls 39a, 39b, 39c, etc., in vertical planes parallel to the plane of the drawing. On the back surface of each cell of the parabolic surface 38 is typically coated with an aluminum, silver, or other reflecting surface layer 52 so as to reflect all the incoming normally incident solar radiation into the round hole 40 in the surface of the reflecting paraboloid. This round hole is placed in the plane normal to the axis of the paraboloid at the focus of the paraboloid. The reflecting surface is supported by thermal insulating material 41. The sides of the cylindrical hole 40 as well as the flat back side of the insulating material 41 are coated with a reflecting layer 52 so as to direct all incoming solar radiation against the thermal conducting layer 37 to be absorbed and converted to thermal energy. On the left side the thermal conducting layer 37 is spaced from the collecting layer 42 by the spacing supports 54 made of thermal insulating material such as glass. On the right side the thermal conducting layer 37 is in thermal contact with layer 1 of the invention. (See FIGS. 1a, 1b and 2). This radiation collection layer 42 may be made of some thin and flexible material such as quartz with the dimensions of each round hole 40 in each small cell typically being as small as 1 micron in diameter and the thickness of layer 42 being as small as 10 microns.

The linewidth of the conductors for the module circuits using electron beam microfabrication may typically be of the order of $10^{-4}$ to $10^{-6}$ cm. Micro circuit manufacturing techniques may be used in the fabrication of the modules which can range in size according to the power output requirements. The maximum power requirements can be achieved using module size larger than the physical limit on circuit miniaturization given in a paper by R. W. Keyes in the May 1975 issue of the Proceedings of the IEEE (pp. 740–767). In this paper, the applicable limit on circuit miniaturization is the electromigration damage to conductors and this limit allows conductors carrying the maximum current requirements of this device to be smaller than $10^{-6}$ cm in diameter. Using larger conductors and increasing the area of modules 7 and 8 in the plane of layers 1 and 3 of FIGS. 1a and 2 up to $10^{-6}$ square centimeters gives a power output capability of the layers 1 and 3 of the order of 10 KW per square meter in the plane of layers 1 and 3 in FIGS. 1a and 2.

A review of microcircuit manufacturing techniques is given in a paper by H. I. Smith in the October 1974 issue of the Proceedings of the IEEE (pp. 1361–1388), and also in a paper by A. N. Broers and R. H. Dennard in Semiconductor Silicon 1973 (pp. 830–841). Other techniques in addition to electron beam microfabrication are feasible for the microfabrication of the circuits of this invention. Among these techniques, X-ray lithography using sensitive polymers as electron resist material may be utilized for simplicity and low cost. The manufacture of micro circuit components for the instant invention can be accomplished using the micro circuit technology described by H. Sobel in the August 1971 issue of the Proceedings of the IEEE (pp. 1200–1211) and by M. Coulton in the October 1971 issue of the Proceedings of the IEEE. Diodes 9, 12, and 24 may typically be classical Schottky barrier diodes or quantum or tunnel diodes. The Schottky diodes may be of the type described by Fetterman et al in Applied Physics Letters, Jan. 15, 1974, page 70. The tunnel diodes may be of the type described by Twu et al in Applied Physics Letters, Nov. 15, 1974 or by Javan in the IEEE Spectrum, October, 1971, page 91. For the rectifying diodes 12 and 24, increasing the nonlinearity increases the efficiency of the device. As shown in the paper by J. C. Yater in the October 1974 issue of the Physical Review A (pp. 1361–1369), the non-linearity obtainable from classical diodes enables the Carnot cycle efficiencies to be obtained. For quantum effect or tunnel diodes the degree of non-linearity of tunnel diodes can be different from that of classical diodes. It can be shown using a similar method of analysis to that given in the above listed paper in the Physical Review by J. C. Yater that the efficiency of rectification is increased using tunnel diodes as the heated diodes 9 when the non-linearity is less than that for classical diodes and as the cooled diodes 12 and 24 when the non-linearity is larger than that of the classical diodes.

As hereinbefore noted, the efficiency of conversion is improved by eliminating or minimizing the power losses from electron cooling, radiation cooling and lead losses. These losses are minimized since there is no electron flow from the hotter layer 1 to the cooler layer 3 of FIGS. 1a and 2, since the thermal barrier 2 can be a vacuum with negligible radiation losses, and since there are no electrical leads from the hot layer 1 to the cooler layer 3 of FIGS. 1a and 2. The inherent higher efficiency of the invention provides an increase of several hundred percent in the efficiency of power conversion over existing thermionic converters, solar cells, or thermoelectric power generators. Since the theoretical efficiency using the classical Schottky barrier diodes for the rectifying diodes 12 and 24 is given by the Carnot cycle efficiency, the thermal cycles are reversible cycles so that the device also operates in a heat pump or refrigeration mode by using an input power to reverse the direct current flow. The circuits of this invention can be made extremely small by current state-of-the-art technology. (See prior references). The mean free path of an electron in a resistive material is as low as $10^{-6}$ cm with the result that conductors can be placed less than every $10^{-5}$ on a heated resistive film without resulting in any significant correlation between the fluctuations of individual circuits. Accordingly, as the elemental circuit size is reduced to the order of the electron mean free path the production of kilowatts of power output per square centimeter of surface area of layer is obtained.

The effect of the statistics of fluctuation effects on the thermally caused electrical fluctuations across a single resistor is that the output power is independent of the physical size or the number of conducting electrons in the resistor. This power is shown by C. J. Bakker and G. Heller in the March 1939 issue of Physica (pp. 262–274) to be approximately $kT/t$, with $k$ being the Boltzmann constant, T being the absolute temperature, and $t$ being the mean time between collisions for an electron. The effective mean time $t$ to give the fluctuation power in a metal resistor is computed in this paper and the result shows an effective electron velocity of $10^8$ cm/sec and an effective mean free-path length of $10^{-6}$ cm so that the effective mean time $t$ is of the order of $10^{-14}$ sec for electrons at room temperature. For this value for $t$ and for $T = 700°$ K the fluctuation power available is of the order of $10^{-6}$W. Conductors placed every $10^{-5}$ cm on an extended heated resistive film result in an available power output of $10^8$W of available fluctuation energy per square meter of a resistive film at a temperature of 700° K when these are used as the resistor 26 in FIG. 4. The thickness of layers 1 and 3 is comparable to the spacing of modules 7 and 8 in the plane of layers 1 and 3. For cubical modules of this size, the potential power output per cubic centimeter of modules is $10^9$W.

The potential barrier of the diodes 9, 12 and 24 and the output voltage of the output power can be optimized for each temperature range so as to achieve the highest possible efficiency for each required operating temperature range. As shown in the above listed paper in the Physical Review by J. C. Yater, the non-linearity of the classical diodes are a function of both the temperature and the capacity of the diode potential barriers. This relationship enables a larger non-linearity to be obtained for the rectifying diodes 12 and 14 of module 7 as these diodes are operated at cooler temperatures. From this relationship the capacity of the diode potential barriers can be designed to achieve the highest possible efficiency for each operating temperature range. For diodes having a larger capacity than required to give the maximum efficiency for a given operating temperature range when operating in the embodiment shown in FIG. 1a, the embodiment shown in FIG. 2 can be used to enable the given diodes to operate at the highest possible efficiency as the temperature of the rectifying module 8 in layers 3 and 28 are lowered.

The reversible cycle resulting from the elimination or minimization of losses thus enables the same thermal cycle to be used in a power conversion mode, a heat pump mode and a refrigeration mode. The same device can be used to generate power for the home, heating for the home and air conditioning for the home. As an example, the power in a square meter of sunlight is converted efficiently by the device to 1 KW of output power. This 1 KW output power can be used as the input power to the same device operating in the efficient heat pump mode between 32° and 80° Fahrenheit. The equivalent heat of 10 KW of power can then be delivered into the higher temperature reservoir.

By using thin flexible layers 1, 3, 37 and 58 that can be shaped and sized so as to be used with maximum efficiency for each heat source including solar, fossil, nuclear and geothermal, the use of a radiation collection layer 42 can achieve a high efficiency when the incoming source of heat is in the form of radiation. For incoming solar radiation on layer 42, the efficiency of the power conversion is increased to a much higher value than can be obtained from existing solar cells. The highest efficiency obtainable from existing silicon solar cell is 16% and the highest theoretical value predicted for any material is 25% for Al Sb at ambient temperatures. The value obtainable from this device is over 90% using classical diodes 12 and 24 in the rectifying modules 8.

The efficient operation of the device can be extended to lower temperature range using the two stage temperature embodiment shown in FIG. 2 in which layers 28 and 29 are added to enable a larger temperature range to be used for each stage of the cycle. This extends the range of operating temperatures to the range where modules 8 in layer 3 and modules 8 in layer 28 are in the temperature range where the diodes of module 8 are in the super-conducting state. The extension of the operating temperature range for the thermal cycles can for some diodes increase the efficiency of the thermal cycle by a factor that is larger than the increase in efficiency for the Carnot cycle for this same extension in the operating temperature range. As hereinbefore noted, this increase in efficiency results from the dependence of the non-linearity of the rectifying diodes 9 and 24 on the diode temperature. As the diode temperature is lowered the diode non-linearity and rectification efficiency are increased. By using the two stage thermal cycle the diode rectification efficiency is increased when larger diodes are used and when the operating temperature range is low. The low operating temperature range of the device for conversion of the thermal energy of the waste heat from other power plants is an example of an application for the two stage thermal cycle.

By making the dimension of the circuit size of the order of $10^{-3}$ cm in each dimension while maintaining a constant power output potential from each cell, megawatts of power output potential per kilogram of module weight is obtained. This is an important improvement in the capability of the device for the application of building satellite solar power stations for supplying energy for earth use.

What is claimed is:

1. A device for directly converting thermal energy to electric energy comprising:
    a. a first layer comprising a plurality of first microcircuit modules with each microcircuit module having a first circuit element for converting thermal energy into electric voltage fluctuations;
    b. a second layer contiguous to said first layer comprising a plurality of second microcircuit modules equal in number to said first microcircuit modules, one each of said second microcircuit modules electrically coupled to one each of said first microcircuit modules and one each of said second microcircuit modules having a circuit element for electrically coupling the voltage fluctuations across a thermal barrier; and,
    c. a third layer comprising an equal plural number of third microcircuit modules as said first and second layers, said third layer being contiguous to said second layer, one each of said third microcircuit modules being electrically coupled to one each of said second microcircuit modules, said third layer being also separated from said first layer by said thermal barrier, each of said third microcircuit modules having at least one non-linear circuit for converting the electric voltage fluctuations to D.C. electric power.

2. The device as recited in claim 1 including in each of said third layer circuit modules first means coupled to each other of said third layer circuit modules for adding the power output of each module in said third layer to the total power output of the plural number of said third microcircuit modules.

3. The device as recited in claim 1 wherein the non-linear circuit elements of the third layer circuit modules are classical effect, e.g., Schottky barrier diodes.

4. The device as recited in claim 1 wherein the non-linear circuit elements of the third layer circuit modules are quantum effect, e.g., tunnel diodes.

5. The device as recited in claim 1 wherein the circuit elements for converting thermal energy to electric voltage fluctuations in the first layer circuit modules are diodes.

6. The device as recited in claim 5 wherein diodes of smaller non-linearity are in the first layer circuit modules and diodes of larger non-linearity are in the third layer circuit modules.

7. The device as recited in claim 6 wherein quantum effect and classical effect diodes are in either the first or third layer circuit modules.

8. The device as recited in claim 1 wherein the circuit element for converting thermal energy to electric voltage fluctuations in the first layer circuit modules is a resistor.

9. The device as recited in claim 1 wherein the circuit element for converting thermal energy to electric voltage fluctuations in the first layer circuit modules are closely spaced contacts to a resistive film.

10. The device as recited in claim 1 wherein the thermal barrier in the second layer is a vacuum chamber between the first and third layers and wherein the second circuit elements in the second layer separately transfer the electric voltage fluctuations of one each first layer circuit module to one each third layer circuit module.

11. The device as recited in claim 10 wherein each of said second circuit elements in said second layer for transferring electric voltage fluctuations of one each first layer circuit modules to one each third layer circuit modules comprises a pair of capacitor plates attached to opposite walls of said vacuum chamber.

12. The device as recited in claim 1 in which said first, second and third microcircuit module dimensions of each of said first, second and third layers are of the order or from $10^{-2}$ cm to $10^{-6}$ cm in each dimension in the plane of the layers of the microcircuit modules.

13. The device as recited in claim 1 wherein the thickness of the layers of said first, second and third microcircuit modules is of the order of $10^{-1}$ cm to $10^{-5}$ cm and in which the layers are flexible.

14. The device as recited in claim 1 including in said first layer of microcircuit modules a radiation collection layer to concentrate and trap the incoming radiation energy from a radiation source.

15. The device as recited in claim 14 wherein the radiation collection layer is a thin flexible layer comprising an array of reflecting paraboloids with the axis of each paraboloid parallel to the direction of the incoming radiation, each paraboloid having a hole on its surface in the plane normal to the paraboloid axis and at the focus of the paraboloid whereby the concentrated radiation is directed on the front surface layer of the first layer circuit modules of the device.

16. The device as recited in claim 1 including in said third circuit element in said third layer microcircuit module an inductor for providing a direct current return path for the rectified current output of the circuit module.

17. The device as recited in claim 16 wherein the circuit element in said third layer of microcircuit modules providing a direct current return path for the full wave rectified current output of the circuit module is a second diode connected with opposite polarity in parallel with the first diode.

18. The device as recited in claim 2 wherein the circuit element in the third layer circuit module for adding the power output of each module to the total output of the plurality of the other third layer modules is a series-parallel circuit of conducting leads.

19. The device as recited in claim 1 wherein electrical energy is applied by an external source to said third layer and heat energy is applied to said third layer from an external source and said heat energy is abstracted by said first layer from said external heat source, whereby said device operates in a reversible mode as a heat pump.

20. The device as recited in claim 1 wherein heat energy is applied to said first layer from an external source and electrical energy is abstracted from said third layer, whereby said device operates as a direct heat-to-electrical converter.

21. The device as recited in claim 19 wherein said external heat source is third layer of a second device as recited in claim 20.

22. The device as recited in claim 21 wherein third layer of said device is contiguous to and in thermal contact with third layer of said second device.

23. A device for directly converting electrical energy to pump thermal energy comprising:
   a. a first layer comprising a first plurality of microcircuit modules, each of said microcircuit modules having at least one nonlinear circuit for converting D.C. electric power to electric voltage fluctuations;
   b. a second layer contiguous to said first layer comprising a plurality of second microcircuit modules equal in number to said first microcircuit modules, one each of said second microcircuit modules electrically coupled to one each of said first microcircuit modules, and one each of said second microcircuit modules having a circuit element for electrically coupling the voltage fluctuations across a thermal barrier; and,
   c. a third layer comprising an equal plural number of third microcircuit modules as each of said first and second layers, said third layer being contiguous to said second layer, one each of said third microcircuit modules being electrically coupled to one each of said second microcircuit modules, said third layer being also separated from said first layer by said thermal barrier, each of said third microcircuit modules having at least one circuit element for converting electric voltage fluctuations into thermal energy,
   whereby electrical energy is supplied to said first layer and heat energy is abstracted by said first layer from an external source and whereby said device operates as a heat pump.

24. A device for directly converting thermal energy to electric energy comprising:
   a. at least one first means for directly converting thermal energy into A.C. electric voltage fluctuations said first means exposed to thermal energy from an external source,
   b. at least one equal number of second means as said first means for converting said electric voltage fluctuations to D.C. electric output power; and,
   c. at least an equal number of third means as each of said first or second means, said third means electrically coupling one each of said first means to one each of said second means, said third means being disposed within a thermal barrier said thermal barrier separating said first and second means.

25. A device as recited in claim 24 wherein said first means is a diode.

26. A device as recited in claim 24 wherein said first means is a resistor.

27. A device as recited in claim 24 wherein said thermal barrier is glass.

28. A device as recited in claim 24 wherein said thermal barrier is a vacuum chamber having a vacuum therein.

29. A device for directly converting electrical energy to pump thermal energy comprising:
   a. at least one first means for directly converting D.C. current into A.C. voltage fluctuations said first means exposed to thermal energy from an external source and said first means supplied with input D.C. power from an external source.
   b. at least one equal number of second means as said first means for converting said electric voltage fluctuations to thermal energy at a higher temperature than thermal energy from said external source,
   c. at least an equal number of third means as each of said first or second means, said third means electrically coupling one each of said first means to one each of said second means, said third means being disposed within a thermal barrier said thermal barrier separating said first and second means.

30. A device for directly converting thermal energy to electric energy comprising:
   a. a first stage directly converting thermal energy to electrical energy comprising:
      1. at least one first means for directly converting thermal energy into A.C. electric voltage fluctuations said first means exposed to thermal energy from external source,
      2. at least one equal number of second means as said first means for converting said electric voltage fluctuations to D.C. electric output power; and,
      3. at least an equal number of third means as each of said first or second means, said third means electrically coupling one each of said first means to one each of said second means, said third means being disposed within a thermal barrier said thermal barrier separating said first and second means.
   b. A second stage for directly converting electrical energy to pump thermal energy comprising:
      1. at least one first means for directly converting D.C. current into A.C. voltage fluctuations wherein said first means of said second stage is exposed to input thermal energy from said second means of said first stage and wherein said first means of said second stage is supplied with input D.C. power from power source external to said second stage and wherein said input D.C. power to said second stage is less than said output D.C. power from said first stage,
      2. at least one equal number of second means as said first means of second stage for converting said electrical voltage fluctuations to thermal energy at a higher temperature than said input thermal energy from said second means of said second stage,
      3. at least an equal number of third means as each of said first or second means, said third means electrically coupling one each of said first means to one each of said second means, said third means being disposed within a thermal barrier said thermal barrier separating said first and second means,
      whereby second stage lowers temperature of second means of first stage of the direct power conversion device.

31. A device for directly converting electrical energy to pump thermal energy comprising:
   a. a first stage directly converting thermal energy to electrical energy comprising:
      1. at least one first means for directly converting thermal energy into A.C. electric voltage fluctuations said first means exposed to thermal energy from external source,
      2. at least one equal number of second means as said first means for converting said electric voltage fluctuations to D.C. electric output power; and,
      3. at least an equal number of third means as each of said first or second means, said third means electrically coupling one each of said first means to one each of said second means, said third means being disposed within a thermal barrier said thermal barrier separating said first and second means.
b. a second stage for directly converting electrical energy to pump thermal energy comprising:
1. at least one first means for directly converting D.C. current into A.C. voltage fluctuations wherein said first means of said second stage is exposed to input thermal energy from said second means of said first stage and wherein said first means of said second stage is supplied with input D.C. power from power source external to said second stage and wherein said input D.C. power to said second stage is larger than said output D.C. power from said first stage,
2. at least one equal number of second means as said first means of second stage for converting said electrical voltage fluctuations to thermal energy at a higher temperature than said input thermal energy from said external source to said first means of said first stage,
3. at least an equal number of third means as each of said first or second means, said third means electrically coupling one each of said first means to one each of said second means, said third means being disposed within a thermal barrier said thermal barrier separating said first and second means, whereby input heat is pumped to higher temperature by the device.

* * * * *